(12) United States Patent
Hayashi

(10) Patent No.: US 9,831,158 B2
(45) Date of Patent: Nov. 28, 2017

(54) LEAD FRAME AND SEMICONDUCTOR DEVICE

(71) Applicant: SHINKO ELECTRIC INDUSTRIES CO., LTD., Nagano (JP)

(72) Inventor: Shintaro Hayashi, Nagano (JP)

(73) Assignee: SHINKO ELECTRIC INDUSTRIES CO., LTD., Nagano (JP)

(\*) Notice: Subject to any disclaimer, the term of this patent is extended or adjusted under 35 U.S.C. 154(b) by 0 days.

(21) Appl. No.: 15/254,054

(22) Filed: Sep. 1, 2016

(65) Prior Publication Data

US 2017/0110389 A1 Apr. 20, 2017

(30) Foreign Application Priority Data

Oct. 16, 2015 (JP) .................................. 2015-205027

(51) Int. Cl.
*H01L 23/495* (2006.01)
*H01L 23/31* (2006.01)
*H01L 21/48* (2006.01)

(52) U.S. Cl.
CPC ...... *H01L 23/4952* (2013.01); *H01L 21/4828* (2013.01); *H01L 23/3114* (2013.01); *H01L 23/49503* (2013.01); *H01L 23/49541* (2013.01); *H01L 23/49548* (2013.01); *H01L 23/49582* (2013.01); *H01L 2224/48091* (2013.01)

(58) Field of Classification Search
CPC ......... H01L 23/49503; H01L 23/49548; H01L 21/4828; H01L 23/3114; H01L 23/4952; H01L 23/49541; H01L 23/49582

USPC .......................................................... 257/676
See application file for complete search history.

(56) References Cited

U.S. PATENT DOCUMENTS

| | | | | |
|---|---|---|---|---|
| 6,197,615 | B1* | 3/2001 | Song ................. | H01L 23/49503 257/E23.037 |
| 7,397,113 | B2* | 7/2008 | Itou ..................... | H01L 21/4828 257/666 |
| 7,405,106 | B2* | 7/2008 | Maloney ............. | H01L 23/3107 257/E23.037 |
| 7,808,089 | B2* | 10/2010 | Nguyen ................. | H01L 24/32 257/666 |
| 8,373,258 | B2* | 2/2013 | Mizusaki .............. | H01L 21/561 257/666 |

(Continued)

FOREIGN PATENT DOCUMENTS

JP 2004-349497 12/2004

*Primary Examiner* — Luan C Thai
(74) *Attorney, Agent, or Firm* — IPUSA, PLLC

(57) ABSTRACT

A semiconductor device includes a lead frame; a semiconductor chip mounted on the lead frame; and an encapsulation resin, wherein a convexo-concave portion including a plurality of concave portions is provided at a covered portion of the lead frame that is covered by the encapsulation resin, wherein the planer shape of each of the concave portions is a circle, the diameter of which is greater than or equal to 0.020 mm and less than or equal to 0.060 mm, or a polygon, the diameter of whose circumcircle is greater than or equal to 0.020 mm and less than or equal to 0.060 mm, and wherein a ratio $S/S_0$ is greater than or equal to 1.7 where "S" is a surface area of the convexo-concave portion that is formed at a flat surface whose surface area is "$S_0$".

26 Claims, 15 Drawing Sheets

(56) References Cited

U.S. PATENT DOCUMENTS 8,420,446 B2* 4/2013 Yo .......................... C25D 5/12
                                                                     257/E21.505
2004/0232534 A1 11/2004 Seki et al.

* cited by examiner

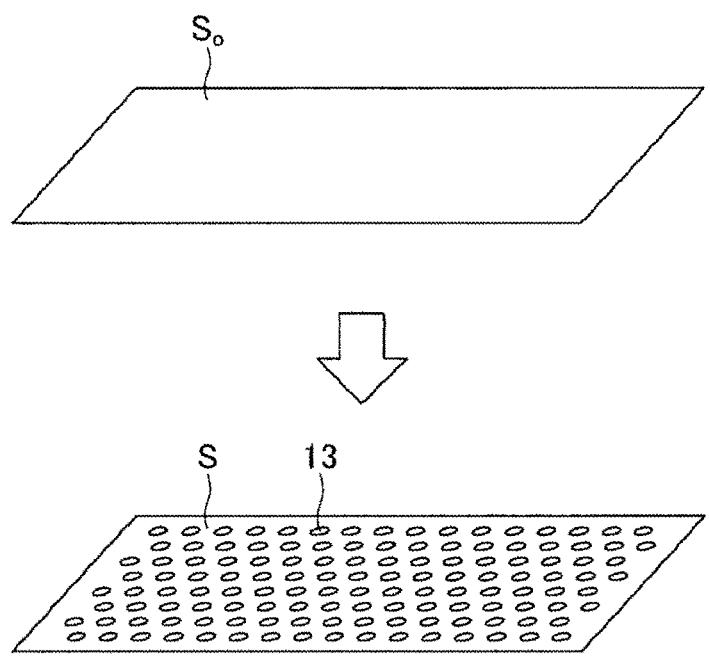

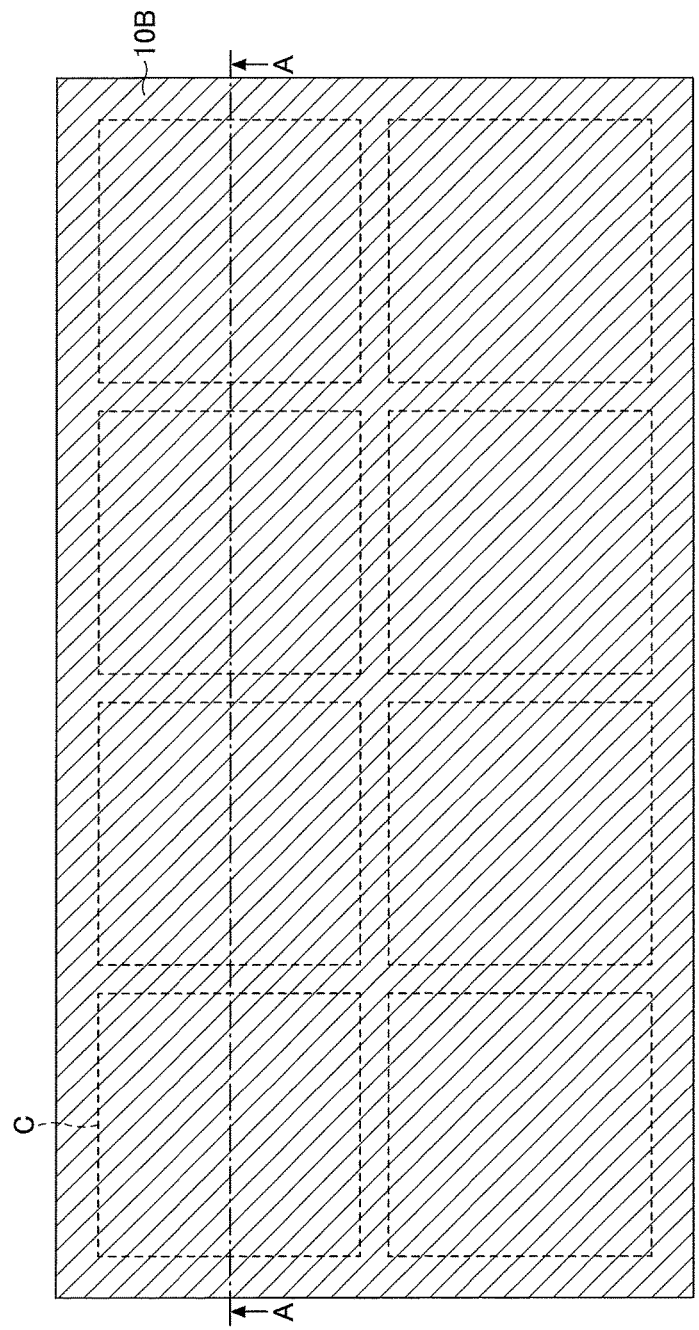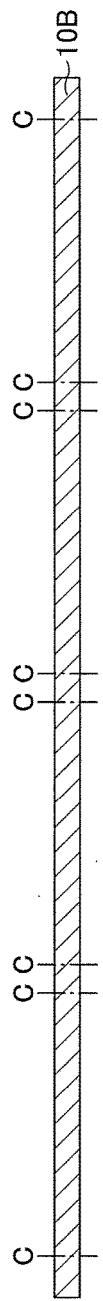
FIG.3A
FIG.3B

LEAD FRAME AND SEMICONDUCTOR DEVICE

CROSS-REFERENCE TO RELATED APPLICATIONS

The present application is based on and claims the benefit of priority of Japanese Priority Application No. 2015-205027 filed on Oct. 16, 2015, the entire contents of which are hereby incorporated by reference.

FIELD

The present invention relates to a lead frame and a semiconductor device.

BACKGROUND

A semiconductor device is known in which a semiconductor chip is mounted on a lead frame and encapsulated by resin. Expansion and contraction are repeatedly applied on such a semiconductor device due to the heat generated when being operated. Thus, there is a risk that delamination occurs between an interface of the lead frame and the resin. In order to improve the adhesion between the lead frame and the resin, a bumpy portion may be formed at a surface of the lead frame. For example, the bumpy portion is formed at the surface of the lead frame by chemically roughing the surface of the lead frame.

Patent Document 1: Japanese Laid-open Patent Publication No. 2004-349497

However, according to the method of forming the bumpy portion by chemically roughing the surface of the lead frame, the bumpy portion is finely formed and the surface area is not large enough to obtain the expected adhesion. Further, for example, there is a case that such a bumpy portion is formed by chemically roughing a lead frame made of copper. In such a case, a silver plating film may be formed on the formed bumpy portion. However, the finely formed bumpy portion may be filled by the silver plating film and the surface area may decrease after forming the silver plating film. In such a case as well, the expected adhesion cannot be obtained.

SUMMARY

The present invention is made in light of the above problems, and provides a semiconductor device in which a convexo-concave portion is formed at a surface of a lead frame and the surface area of the convexo-concave portion is increased to improve the adhesion with resin.

According to an embodiment, there is provided a semiconductor device including a lead frame; a semiconductor chip mounted on the lead frame; and an encapsulation resin that covers the lead frame and the semiconductor chip, wherein a convexo-concave portion including a plurality of concave portions is provided at a covered portion of the lead frame that is covered by the encapsulation resin, wherein the planar shape of each of the concave portions is a circle, the diameter of which is greater than or equal to 0.020 mm and less than or equal to 0.060 mm, or a polygon, the diameter of whose circumcircle is greater than or equal to 0.020 mm and less than or equal to 0.060 mm, and wherein a ratio $S/S_0$ is greater than or equal to 1.7 where "S" is a surface area of the convexo-concave portion that is formed at a flat surface whose surface area is "$S_0$".

BRIEF DESCRIPTION OF DRAWINGS

Other objects, features and advantages of the present invention will become more apparent from the following detailed description when read in conjunction with the accompanying drawings.

FIG. 2 is a view for describing an S ratio;

FIG. 3A and FIG. 3B are views illustrating an example of manufacturing steps of the semiconductor device of the first embodiment;

DESCRIPTION OF EMBODIMENTS

Figure 1A:
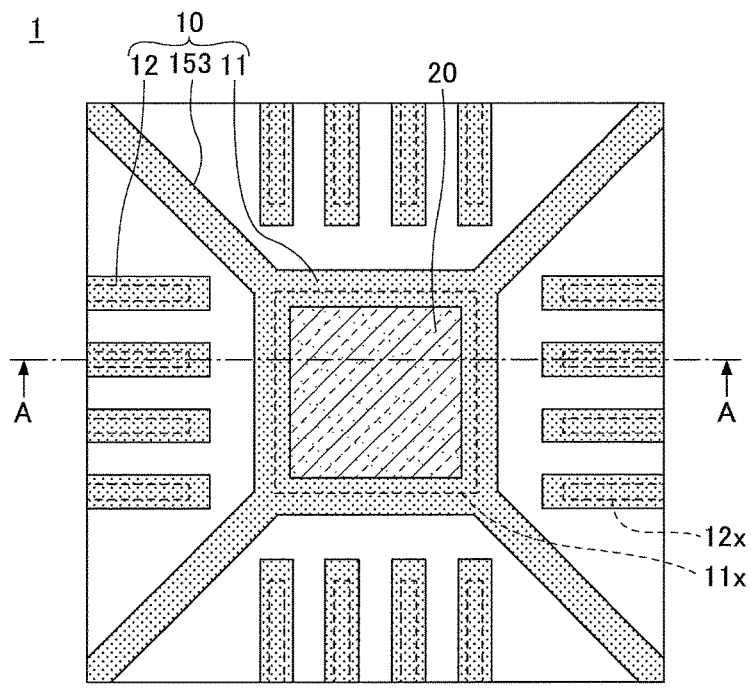
FIG. 1A to FIG. 1D are views illustrating an example of a semiconductor device of a first embodiment.

The invention will be described herein with reference to illustrative embodiments. It is to be noted that, in the description of the drawings, the same components are given the same reference numerals, and explanations are not repeated.

First Embodiment

Structure of Semiconductor Device of First Embodiment

Figure 1B:
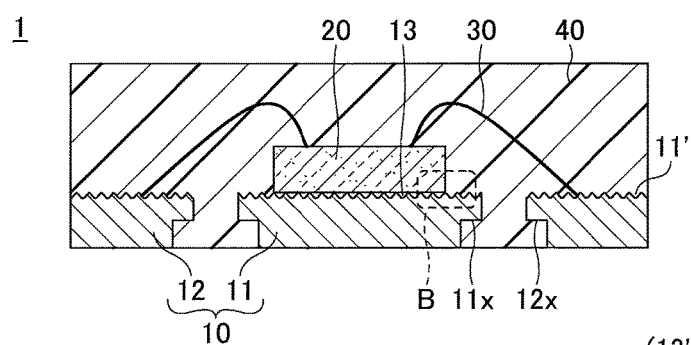
Figure 1C:
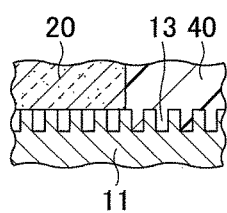
Figure 1D:
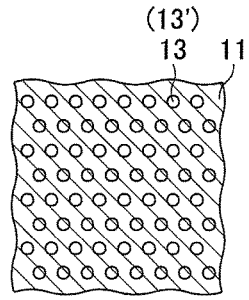

First, a structure of a semiconductor device of a first embodiment is described. FIG. 1A to FIG. 1D are views illustrating an example of a semiconductor device 1 of the first embodiment. FIG. 1A is a plan view. FIG. 1B is a cross-sectional view taken along an A-A line of FIG. 1A. FIG. 1C is a cross-sectional view in which a portion "B" in FIG. 1B is enlarged. FIG. 1D is a plan view in which the portion "B" in FIG. 1B is enlarged.

With reference to FIG. 1A to FIG. 1D, the semiconductor device 1 mainly includes a lead frame 10, a semiconductor chip 20, metal wires 30 (bonding wires) and a resin portion 40 (encapsulation resin). The semiconductor device 1 is a so-called Quad Flat Non-leaded package (QFN) type semiconductor device.

Here, the metal wires 30 and the resin portion 40 are not illustrated in FIG. 1A for explanation purposes. Further, the semiconductor chip 20 and the resin portion 40 are not illustrated in FIG. 1D for explanation purposes.

In this embodiment, a semiconductor chip 20 side of the semiconductor device 1 is referred to as an upper side or one side, and a lead frame 10 side of the semiconductor device 1 is referred to as a lower side or the other side. Further, a surface of each component at the semiconductor chip 20 side is referred to as one surface or an upper surface, and a surface of each component at the lead frame 10 side is referred to as the other surface or a lower surface. However, the semiconductor device 1 may be used in an opposite direction or may be used at an arbitrary angle. Further, in this embodiment, "in a planar view" means that an object is seen in a direction that is normal to one surface of the lead frame 10, and a "planar shape" means a shape of an object seen in the direction that is normal to the one surface of the lead frame 10.

In the semiconductor device 1, the lead frame 10 includes a die pad 11 (a chip mounting portion) on which the semiconductor chip 20 is mounted, a plurality of leads 12 (terminal portions) and support bars 153. For the material of the lead frame 10, metal materials, such as copper (Cu), copper alloy, 42 Alloy (alloy of Fe and Ni) or the like may be used, for example.

The leads 12 are electrically independent from the die pad 11, and a plurality of the leads 12 are provided with a predetermined pitch around the die pad 11 in a planar view. Alternatively, the leads 12 are not necessarily provided at four sides of the die pad 11 and may be provided only at both sides of the die pad 11, for example. The width of each of the leads 12 may be about 0.2 mm, for example. The pitch of the leads 12 may be about 0.4 mm, for example.

A step portion 11x is provided at an outer periphery of the lower surface of the die pad 11. In other words, a lower surface of the die pad 11 is formed to have a dimension smaller than that of an upper surface of the die pad 11. A step portion 12x is provided at an outer periphery of the lower surface of the lead 12 except at a side that is exposed from a side surface of the resin portion 40. In other words, the lower surface of the lead 12 is formed to have an area smaller than that at the upper surface of the lead 12. By providing the step portions 11x and 12x, resin that constitutes the resin portion 40 is provided to back surfaces of the step portions 11x and 12x (to the lower surfaces of the die pad 11 and the leads 12), and the removal of the die pad 11 and the leads 12 from the resin portion 40 can be prevented.

The support bars 153 are members that support the die pad 11 before the lead frame 10 is individualized. Although not illustrated in the drawings, the back surface of the support bars 153 is half-etched, and the thickness of the support bars 153 is substantially the same as the step portions 11x and 12x. Thus, the back surface of the support bars 153 is completely covered by the resin portion 40 and does not expose from the resin portion 40.

The semiconductor chip 20 is mounted on the die pad 11 in a face-up manner. Electrode terminals formed at an upper surface side of the semiconductor chip 20 are electrically connected (wire bonding) to the upper surfaces of the leads 12 via metal wires 30, respectively. The metal wires 30 may be gold wires, copper wires or the like.

The resin portion 40 encapsulates the lead frame 10, the semiconductor chip 20 and the metal wires 30. Here, the lower surface of the die pad 11, the lower surfaces of the leads 12, and the side surfaces of the leads 12 at the outer periphery portion of the semiconductor device 1 are exposed from the resin portion 40. This means that the resin portion 40 encapsulates the semiconductor chip 20 and the like such that portions of the die pad 11 and the leads 12 are exposed. The portions of the leads 12 that are exposed from the resin portion 40 become external connection terminals.

The lower surface of the die pad 11 and the lower surfaces of the leads 12 may be substantially flush with the lower surface of the resin portion 40. The side surfaces of the leads 12 at the outer periphery portion of the semiconductor device 1 may be substantially flush with the side surface of the resin portion 40. For the resin portion 40, so-called mold resin or the like in which fillers are contained in epoxy resin may be used, for example.

As illustrated in FIG. 1C and FIG. 1D, a high density convexo-concave portion 13 is provided at the upper surface of the lead frame 10 (the upper surface of the die pad 11, the upper surfaces of the leads 12 and the upper surfaces of the support bars 153). The area at which the high density convexo-concave portion 13 is provided is schematically illustrated by a dot pattern in FIG. 1A and by a wavy line in FIG. 1B.

The high density convexo-concave portion 13 is not provided at the lower surface and the side surface of the die pad 11, the lower surface and the side surface of each of the leads 12 and the lower surfaces and the side surfaces of the step portions 11x and 12x. This means that the high density convexo-concave portion 13 is not provided at portions of the die pad 11 and the leads 12 that are exposed from the resin portion 40. The surface of the lead frame 10 that is exposed from the resin portion 40 is formed to be a more flat surface compared with the surface at which the high density convexo-concave portion 13 is formed.

However, this is not essential, and the high density convexo-concave portion 13 may be provided at the lower surface of the die pad 11 or the lower surfaces of the leads 12 that are exposed from the resin portion 40, for example. In such a case, the high density convexo-concave portion 13 does not contribute to improve the adhesion with the resin portion 40. However, a bonding material such as solder or the like is provided at the lower surface of the die pad 11 or the lower surfaces of the leads 12. The high density convexo-concave portion 13 may improve the adhesion between the die pad 11 or the leads 12 with the bonding material.

Further, the high density convexo-concave portion 13 may be formed at the lower surface (the half-etched portion of the back surface of the lead frame 10) of the step portion 11x or the step portions 12x. In such a case, the adhesion with the resin portion 40 can be further improved.

The high density convexo-concave portion 13 is a portion in which a plurality of fine concave portions 13' (dimples) each having a substantially circular planar shape are arranged as a matrix with high density, for example. The high density convexo-concave portion 13 may be formed as a lattice such as a face centered lattice or the like, for example. Although each of the concave portions of the high density convexo-concave portion 13 is illustrated to have a rectangular cross-sectional view in FIG. 10, actually, each of the concave portions is formed to have a curved cross-sectional view curved toward a bottom surface of the respective concave portion. In other words, each of the concave portions is formed to have a U-shape in a cross-sectional view.

It is preferable that the diameter of the concave portion is within a range of 0.020 to 0.060 mm, and more preferably within a range of 0.020 to 0.040 mm. It is preferable that the pitch of the concave portions is within a range of 0.040 to 0.080 mm. It is preferable that the depth of the concave portion is about 35 to 70% of the thickness of the lead frame 10, and may be about 0.010 to 0.050 mm, for example.

Alternatively, the planar shape of the concave portion of the high density convexo-concave portion 13 may not be a circle and may be a polygon such as a hexagon or the like, for example. In such a case, it is preferable that the diameter of a circumcircle (a minimum bounding circle) of the polygon is within a range of 0.020 to 0.060 mm, and more preferably, within a range of 0.020 to 0.040 mm. It is preferable that the pitch of the circumcircles of the polygon is within a range of 0.040 to 0.080 mm.

If the diameter of the concave portion or the diameter of the circumcircle of the polygon is less than 0.020 mm or greater than 0.060 mm, it is difficult to increase an S ratio, and the adhesion with the resin portion 40 is not improved.

The S ratio is described with reference to FIG. 2. With reference to FIG. 2, the S ratio means a ratio of a surface area (an actual surface area) "S" of the convexo-concave portion 13 that is formed at a flat surface whose surface area is "$S_0$", with respect to the surface area $S_0$ of the flat surface. In other words, the S ratio=$S/S_0$. Specifically, the surface area "$S_0$" expresses dimension of a substantially flat surface. The surface area "$S_0$" expresses dimension of the convexo-concave portion 13 including side surfaces as well.

In this embodiment, the high density convexo-concave portion 13 includes a plurality of concave portions, where the planar shape of each of the concave portions is a circle, the diameter of which is greater than or equal to 0.020 mm and less than or equal to 0.060 mm, or a polygon, the diameter of whose circumcircle is greater than or equal to 0.020 mm and less than or equal to 0.060 mm. In other words, the polygon defines a circumcircle having a diameter greater than or equal to 0.020 mm and less than or equal to 0.060 mm. Furthermore, the S ratio of the convexo-concave portion is greater than or equal to 1.7.

As such, by providing the high density convexo-concave portion 13, the surface area of the lead frame 10 that contacts the resin portion 40 increases to generate an anchor effect. Thus, the adhesion between the lead frame 10 and the resin portion 40 can be improved. As a result, delamination at the interface between the lead frame 10 and the resin portion 40 can be prevented. Here, as the S ratio of the bumpy portion, formed by the chemically roughing the surface, is about 1 to 1.2, it is difficult to ensure the sufficient adhesion.

As described above, for the material of the lead frame 10, copper (Cu), copper alloy, 42 Alloy (alloy of Fe and Ni) or the like may be used, for example. Further, in order to facilitate the wire bonding or the like, plating 11' such as silver (Ag) plating or the like may be performed on the upper surface of the lead frame 10. The thickness of the silver plating is generally about 2 to 6 μm. In this embodiment, even when the silver plating is performed, the high density convexo-concave portion 13 is not flattened and the S ratio about the same as before performing the silver plating can be maintained. Thus, even when silver (Ag) plating or the like is performed on the upper surface of the lead frame 10, the adhesion between the lead frame 10 and the resin portion 40 can be improved.

Alternatively, instead of the silver film, when an Au film, a Ni/Au film (a metal film in which a Ni film and an Au film are stacked in this order), or a Ni/Pd/Au film (a metal film in which a Ni film, a Pd film and an Au film are stacked in this order) or the like is formed by plating, the adhesion between the lead frame 10 and the resin portion 40 can be improved.

Here, the high density convexo-concave portion 13 is provided at portions of the upper surfaces of the leads 12 that are connected to the metal wires 30, respectively, in this embodiment. However, it may be preferable not to form the high density convexo-concave portion 13 at such portions based on a connecting condition (a condition of wire bonding) with the metal wires 30. In such a case, the high density convexo-concave portion 13 is not formed at the portions of the upper surfaces of the leads 12 that are connected to the metal wires 30, respectively.

Method of Manufacturing Semiconductor Device of First Embodiment

Next, a method of manufacturing the semiconductor device 1 of the first embodiment is described. FIG. 3A to FIG. 8C are views illustrating an example of manufacturing steps of the semiconductor device 1 of the first embodiment.

First, in a step illustrated in FIG. 3A and FIG. 3B, a metal plate material 10B having a predetermined shape is prepared. FIG. 3A is a plan view, and FIG. 3B is a cross-sectional view taken along an A-A line in FIG. 3A. In the plan view of FIG. 3A, hatchings same as those given in the cross-sectional view of FIG. 3B are given to the corresponding components for explanation purposes. The plate material 10B is a member that finally becomes a plurality of the lead frames 10 (see FIG. 1A to FIG. 1D) after being cut along cut lines illustrated by broken lines for each of the individual areas C. For the material of the plate material 10B, metal materials, such as copper (Cu), copper alloy, 42 Alloy or the like may be used, for example. The thickness of the plate material 10B may be about 100 to 200 μm, for example.

Next, in a step illustrated in FIG. 4A to FIG. 4D, a photosensitive resist 300 is formed at an upper surface of the plate material 10B, and a photosensitive resist 310 is formed at a lower surface of the plate material 10B. Then, open portions 300x and 300y, and open portions 310x are formed at predetermined positions by exposing and developing the resists 300 and 310, respectively.

The open portions 300x and 310x are for forming the die pad 11, the leads 12 and the support bars 153 in the plate material 10B. The open portions 300y are for forming the high density convexo-concave portion 13.

Figure 4A:
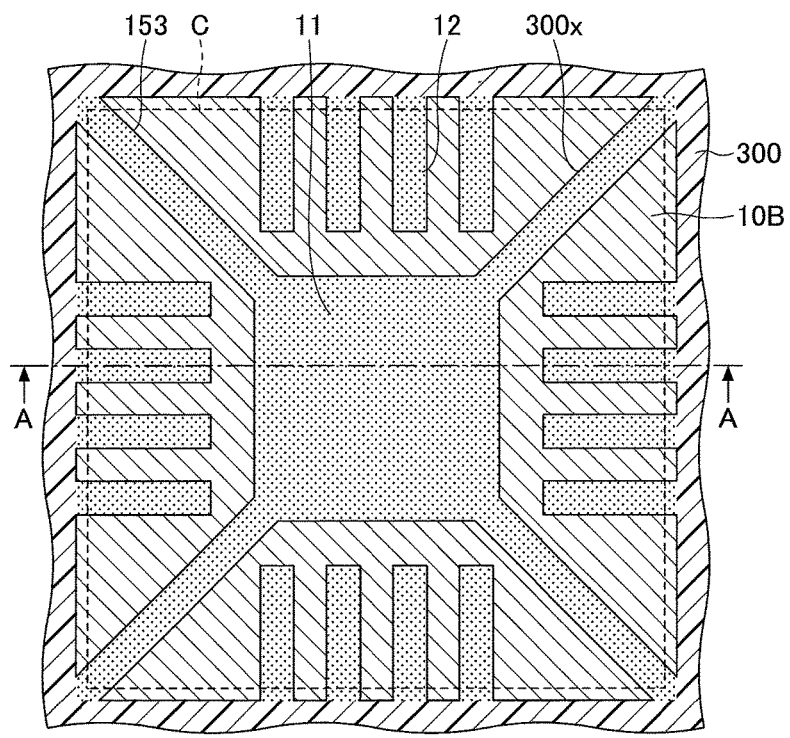
FIG. 4A to FIG. 4D are views illustrating an example of the manufacturing steps of the semiconductor device of the first embodiment.
Figure 4B:
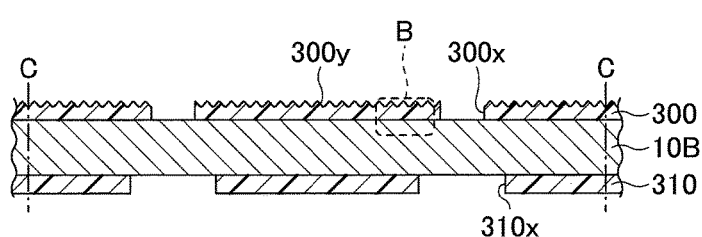
Figure 4C:
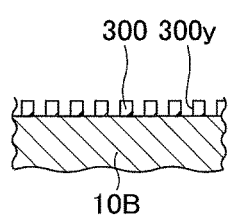
Figure 4D:
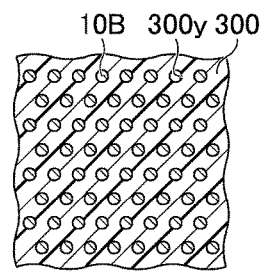
Figure 5A:
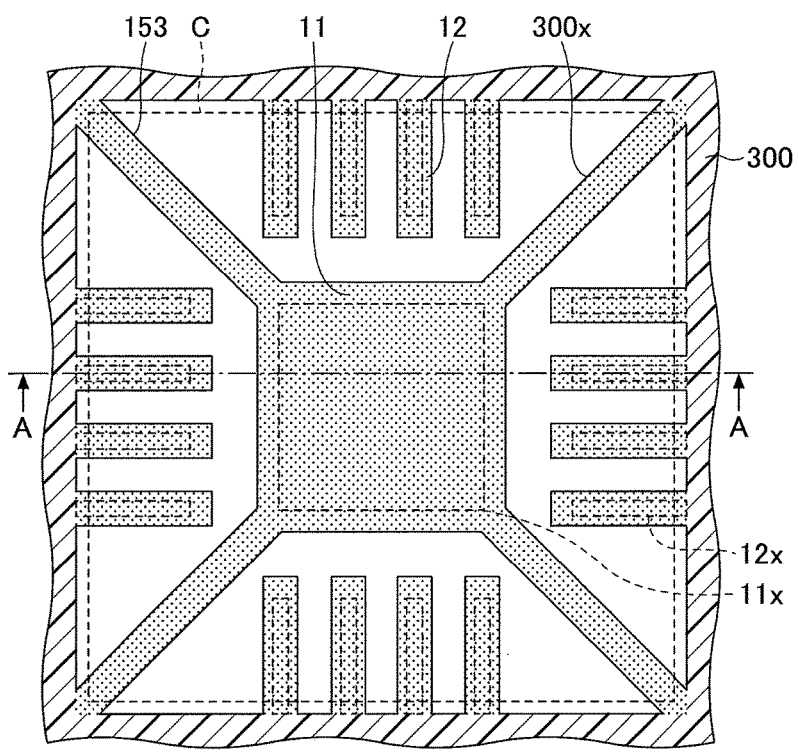
FIG. 5A to FIG. 5D are views illustrating an example of the manufacturing steps of the semiconductor device of the first embodiment.
Figure 5B:
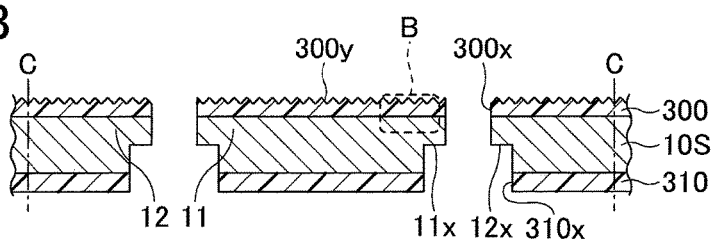
Figure 5C:
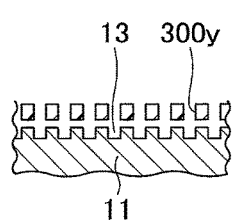
Figure 5D:
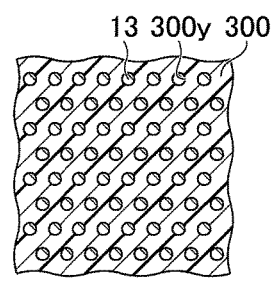
Figure 6A:
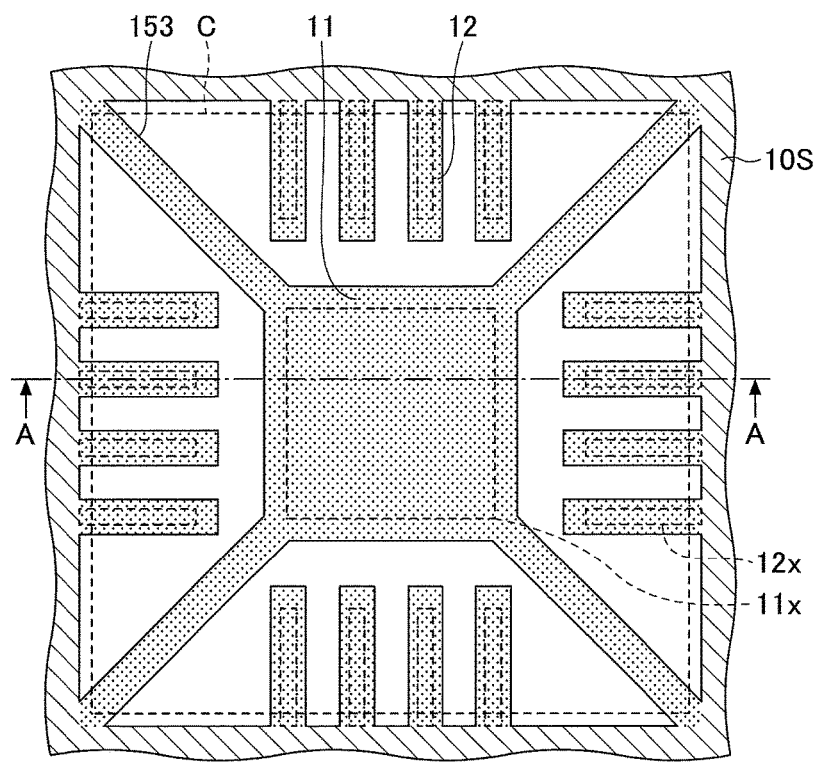
FIG. 6A to FIG. 6D are views illustrating an example of the manufacturing steps of the semiconductor device of the first embodiment.
Figure 6B:
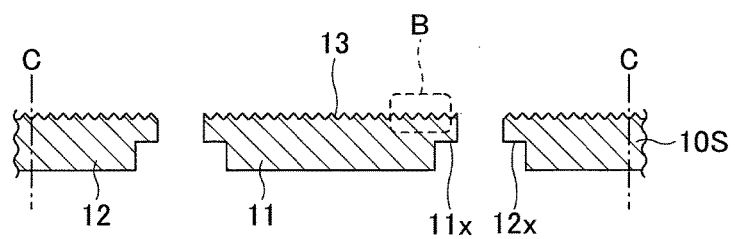
Figure 6C:
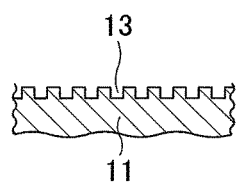
Figure 6D:
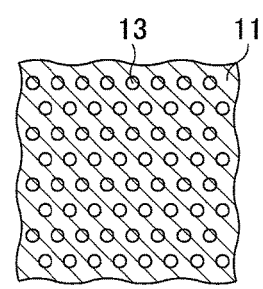

FIG. 4A to FIG. 4D are views illustrating one of the individual areas C in FIG. 3A and FIG. 3B. FIG. 4A is a plan view. FIG. 4B is a cross-sectional view taken along an A-A line of FIG. 4A. FIG. 4C is a cross-sectional view in which a portion "B" in FIG. 4B is enlarged. FIG. 1D is a plan view in which the portion "B" in FIG. 4B is enlarged. In FIG. 4A and FIG. 4D, hatchings same as those given in the cross-sectional view of FIG. 4B are given to the corresponding components for explanation purposes. The area at which the open portions 300y for forming the high density convexo-concave portion 13 are provided is schematically illustrated by a dot pattern in FIG. 4A and by a wavy line in FIG. 4B. This is the same for following FIG. 5A to FIG. 5D and FIG. 6A to FIG. 6D.

The open portions 300y are a plurality of circular openings arranged as a matrix, for example. It is preferable that the diameter of each of the circular openings is within a range of 0.020 to 0.060 mm, more preferably, within a range of 0.020 to 0.040 mm. It is preferable that the pitch of the circular openings is within a range of 0.040 to 0.080 mm. The individual area C becomes a covered area that is covered by the resin portion 40 after mounting the semiconductor chip 20. The high density convexo-concave portion 13 is formed at least at a portion of the covered area.

Next, in a step illustrated in FIG. 5A to FIG. 5D, the plate material 10B is etched (by wet etching, for example) using the resists 300 and 310 as etching masks. The plate material 10B is penetrated at portions where the open portions 300x and 310x are overlapped in a planar view. Only the lower surface of the plate material 10B is half-etched at portions where only the open portions 310x are formed in a planar view (because the open portion 310x is larger than the open portion 300x), and the step portions 11x and 12x are formed.

The lower surfaces of portions that become the support bars 153 are exposed in the open portions 310x, and only the lower surface of the plate material 10B is half-etched at the portions. Then, the support bars 153 having a thickness substantially the same as the step portions 11x and 12x are formed.

Further, regarding the open portions 300y of the resist 300, as etchant does not contact a portion of the plate material 10B around each of the circular openings (where the resist 300 is formed) at the beginning of an etching process, the portion is not etched at first. Thereafter, in the middle of the etching process to the end of the etching process, the etchant penetrates from each of the circular openings and the portion around the respective circular opening is also started to be etched. As a result, the depth of the portion around each of the circular openings becomes shallower than that at the respective circular opening. Thus, the concave portion is formed to have a circular planer shape where a portion in the circular opening is deeper than the portion around the circular opening, and the high density convexo-concave portion 13 is formed.

With this, the lead frame 10S is completed. The lead frame 10S includes a plurality of individual areas C, which becomes the lead frame 10, and the die pad 11, the plurality of leads 12 and the support bars 153 are formed in each of the individual areas C.

The thickness of the lead frame 10S becomes thinner than that before the etching at portions where the open portions 300y are formed. By changing the planer shape, the size or the pitch of the openings of the open portions 300y, the high density convexo-concave portion 13 provided with concave portions with various shapes, depths or the like may be formed. Further, as the etching amount is changed by changing the planer shape, the size or the pitch of the openings of the open portions 300y, the thickness of the lead frame 10S may be adjusted to be a desired thickness.

Figure 7:
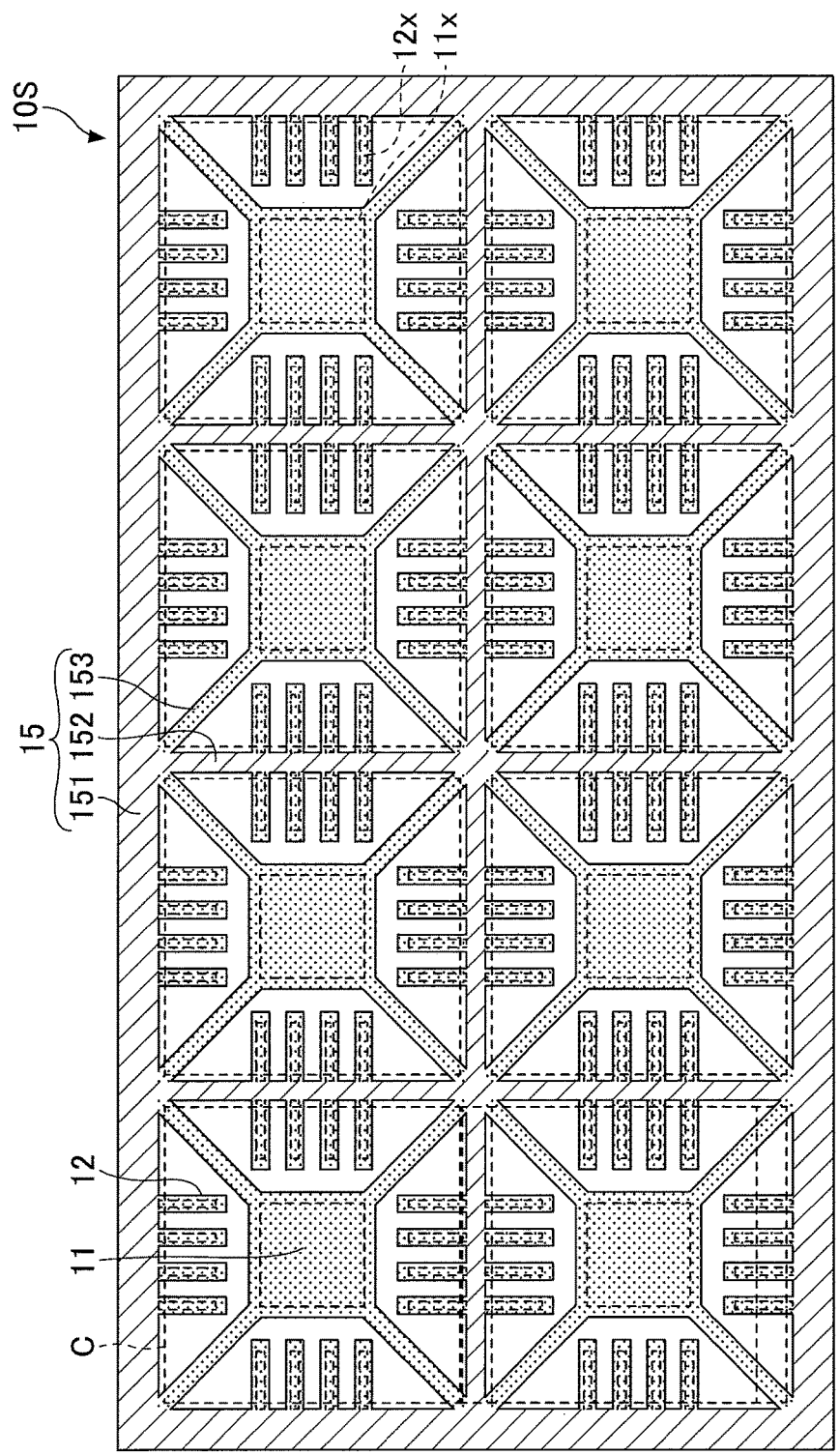
FIG. 7 is a view illustrating an example of the manufacturing steps of the semiconductor device of the first embodiment.

Next, in a step illustrated in FIG. 6A to FIG. 6D, the resists 300 and 310 illustrated in FIG. 5A to FIG. 5D are removed. With this, a lead frame 10S having the planer shape as illustrated in FIG. 7 is obtained. The lead frame 10S of FIG. 7 has a structure in which the plurality of individual areas C, which become the lead frames 10, are connected by a connecting portion 15. The connecting portion 15 includes an outer frame portion 151, a dam bar 152 and the support bars 153. The outer frame portion 151 is formed at an outer edge portion of the lead frame 10S as a frame. The dam bar 152 is provided inside the outer frame portion 151 like a lattice between the individual areas C. Four support bars 153 are provided in each of the individual areas C in an inclined manner with respect to the die pad 11. One ends of the support bars 153 are connected to the outer frame portion 151 or the dam bar 152 and the other ends of the support bars 153 are connected to four corners of the die pad 11, respectively, to support the die pad 11. The plurality of leads 12 are connected to the outer frame portion 151 or the dam bar 152 such as to surround the die pad 11 at the individual area C side.

After the steps of FIG. 6A to FIG. 6D and FIG. 7, an Ag film, an Au film, a Ni/Au film (a metal film in which a Ni film and an Au film are stacked in this order), a Ni/Pd/Au film (a metal film in which a Ni film, a Pd film and an Au film are stacked in this order) or the like may be formed by plating or the like at a predetermined portion of the lead frame 10S. For example, in order to facilitate the wire bonding, silver plating may be performed on the upper surfaces of the leads 12.

The manufacturing steps of the semiconductor device 1 are further described. First, in a step illustrated in FIG. 8A, the semiconductor chip 20 is mounted on the die pad 11 of each of the individual areas C in a face-up manner. The semiconductor chip 20 may be mounted on the die pad 11 via a die attach film. In such a case, the die attach film may be cured after being heated to predetermined temperature.

Figure 8A:
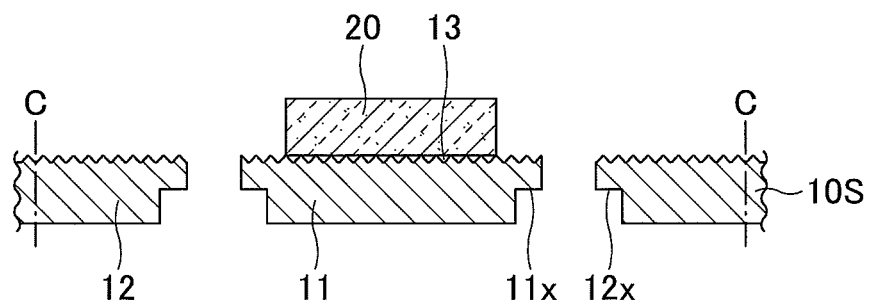
FIG. 8A to FIG. 8C are views illustrating an example of the manufacturing steps of the semiconductor device of the first embodiment.
Figure 8B:
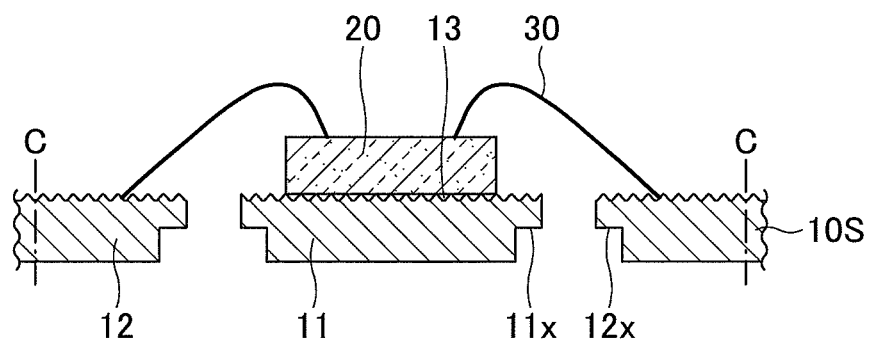

Next, in a step illustrated in FIG. 8B, electrode terminals formed at the upper surface of the semiconductor chip 20 are electrically connected to the leads 12 via the metal wires 30, respectively. The metal wires 30 may be connected to the electrode terminals of the semiconductor chip 20 and the leads 12 by wire bonding, for example.

Figure 8C:
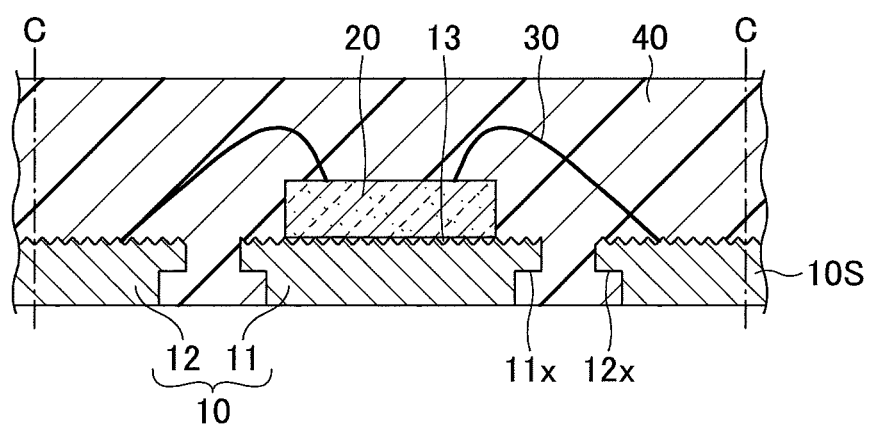

Next, in a step illustrated in FIG. 8C, the resin portion 40 that encapsulates the lead frame 10S, the semiconductor chip 20 and the metal wires 30 is formed. For the resin portion 40, so-called mold resin or the like in which fillers are contained in epoxy resin may be used, for example. The resin portion 40 may be formed by a transfer molding process, a compression molding process or the like, for example.

When forming the resin portion 40, in order to prevent the resin from being formed at the lower surface of the lead frame 10S, a protection tape or the like is attached at the lower surface of the lead frame 10S. As the high density convexo-concave portion 13 is not formed at the lower surface of the lead frame 10S, the protection tape or the like can be attached at the lower surface of the lead frame 10S without a space. Thus, the resin is prevented from being formed at the lower surface of the lead frame 10S.

Alternatively, as long as the protection tape or the like is surely attached, only an outer periphery portion of the lower surface of the die pad 11 may be a flat surface and the high density convexo-concave portion 13 may be formed at an inner side, for example. In such a case, an effect of improving the adhesion between a bonding material such as solder or the like that is provided at the lower surface of the die pad 11 and the lower surface of the die pad 11 can be obtained when mounting the manufactured semiconductor device 1.

Thereafter, the structure illustrated in FIG. 8C is cut along the cut lines to obtain a plurality of the semiconductor devices 1 (see FIG. 1A to FIG. 1D) corresponding to the individual areas C. The structure may be cut by a slicer or the like, for example.

The semiconductor device 1 may be shipped as a single product, or the lead frame 10S illustrated in FIG. 7, which is before being individualized, may be shipped as a product. For the latter case, a person who obtains the lead frame 10S as a product may perform the steps illustrated in FIG. 8A to FIG. 8C, and may obtain a plurality of the semiconductor devices 1.

As such, according to the manufacturing steps of the lead frame 10S, a predetermined pattern for forming the high density convexo-concave portion 13 is provided at the etching mask used for forming the die pad 11, the leads 12 and the support bars 153 by etching the plate material 10B. With this, the high density convexo-concave portion 13 can be formed in the same step as forming the die pad 11, the leads 12 and the support bars 153. Thus, the manufacturing steps can be efficient and the manufacturing cost can be reduced.

Further, as the die pad 11, the leads 12, the support bars 153 and the high density convexo-concave portion 13 can be formed at the same time by the same etching mask(s), misalignment of these parts does not occur in principle. Thus, the high density convexo-concave portion 13 can be formed at predetermined positions of the die pad 11, the leads 12 and the support bars 153.

On the other hand, according to a conventional method in which etching for roughing a surface is performed separately in addition to etching for forming a die pad, leads and support bars, manufacturing steps are complicated, manufacturing cost increases and accuracy of position of a roughed area is worsened.

Second Embodiment

In the second embodiment, an example of a Quad Flat Package (QFP) is described. In the second embodiment, the same components already explained above are given the same reference numerals, and explanations are not repeated.

Figure 9:
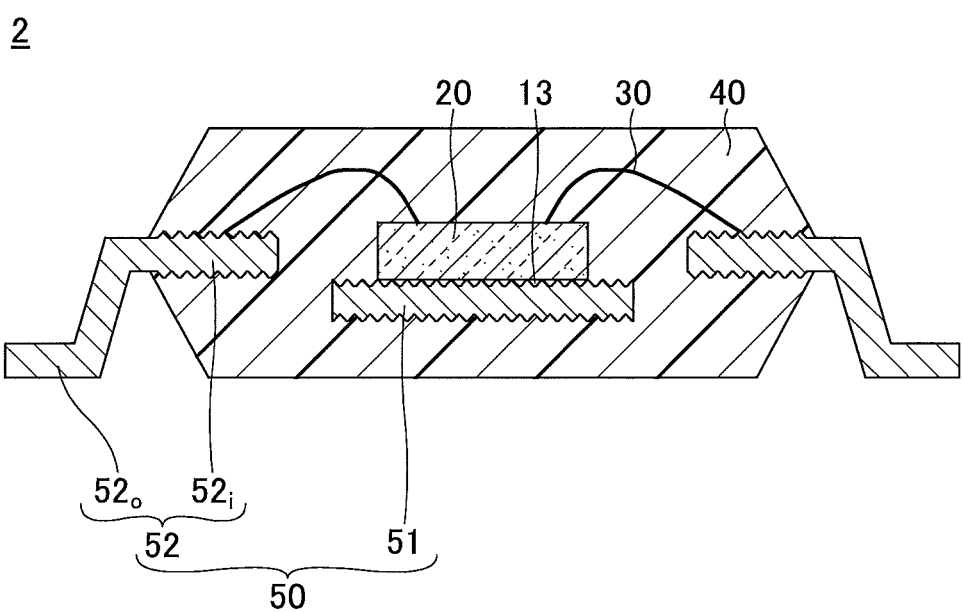
FIG. 9 is a cross-sectional view illustrating an example of a semiconductor device of a second embodiment.

FIG. 9 is a cross-sectional view illustrating an example of a semiconductor device 2 of the second embodiment. With reference to FIG. 9, the semiconductor device 2 mainly includes a lead frame 50, a semiconductor chip 20, metal wires 30 (bonding wires) and a resin portion 40. The semiconductor device 2 is a so-called QFP type semiconductor device.

Figure 10:
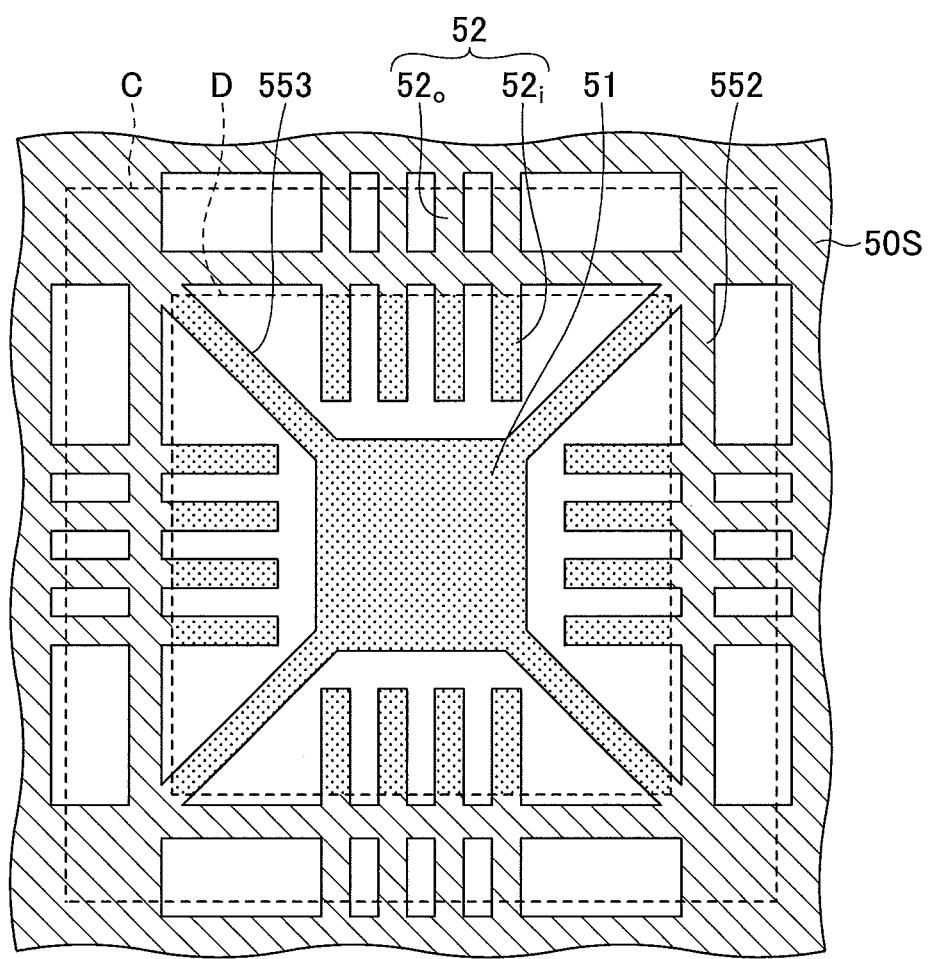
FIG. 10 is a plan view partially illustrating an example of a lead frame of the second embodiment.

In the semiconductor device 2, the lead frame 50 includes a die pad 51 (a chip mounting portion) on which the semiconductor chip 20 is mounted, a plurality of leads 52 (terminal portions) and support bars 553 (see FIG. 10). The material of the lead frame 50 may be the same as that of the lead frame 10, for example.

The leads 52 includes inner leads 52$i$ and outer leads 52$o$. The upper surfaces of the inner leads 52$i$ are electrically connected to the electrode terminals formed at the upper surface side of the semiconductor chip 20 via the metal wires 30, respectively. The inner leads 52$i$ are encapsulated by the resin portion 40. The outer leads 52$o$ are extended from the inner leads 52$i$ and exposed from the resin portion 40. The outer leads 52$o$ are bent at outside of the resin portion 40 and are connected to external wirings, respectively, via solder or the like. Different from the first embodiment, the lower surface of the die pad 51 is not exposed from the resin portion 40.

In the semiconductor device 2, the high density convexo-concave portion 13 expressed by a wavy line, that is the same as illustrated in FIG. 1B and FIG. 1C, is formed at an upper surface and a lower surface of the die pad 51, upper surfaces and lower surfaces of the inner leads 52$i$ and upper surfaces and lower surfaces of the support bars 553. With this, the surface area of a portion of the lead frame 50 that contacts the resin portion 40 increases to generate an anchor effect. Thus, the adhesion between the lead frame 50 and the resin portion 40 can be improved. As a result, delamination at the interface between the lead frame 50 and the resin portion 40 can be prevented.

For manufacturing the semiconductor device 2, as illustrated in FIG. 10 for example, a lead frame 50S in which the outer leads 52$o$ are formed around the inner leads 52$i$ via a dam bar 552 may be used. In this case as well, similar to the structure of FIG. 7, a structure in which a plurality of the structures of FIG. 10 are connected may be used. The lead frame 50S may be manufactured by the manufacturing steps similar to those of the lead frame 10S.

Basic steps for manufacturing the semiconductor device 2 are the same as those of the semiconductor device 1. In addition, a bending step for bending the outer leads 52$o$ or the like is necessary. Further, an area D within the individual area C is encapsulated by the resin portion 40 in the semiconductor device 2. Thus, the high density convexo-concave portion 13 (portions illustrated by dot patterns in FIG. 10) is provided at the upper surface of the die pad 51, the upper surfaces of the inner leads 52$i$ and the upper surfaces of the support bars 553 in the area D in the lead frame 50S of FIG. 10. Further, not illustrated in the drawings, the high density convexo-concave portion is also formed at the lower surface of the die pad 51, the lower surfaces of the inner leads 52$i$ and the lower surfaces of the support bars 553 in the area D.

Further, an example in which the lower surface of the die pad 51 is not exposed from the resin portion 40 is illustrated in FIG. 9. Alternatively, similar to the semiconductor device 1 (QFN type semiconductor device), the lower surface of the die pad 51 may be exposed from the resin portion 40. In such a case, step portions corresponding to the step portions 11$x$ may be provided at the lower surface of the die pad 51. Further, the high density convexo-concave portion 13 may not be formed at the lower surface of the die pad 51 that is exposed from the resin portion 40.

Example 1

Figure 11A:
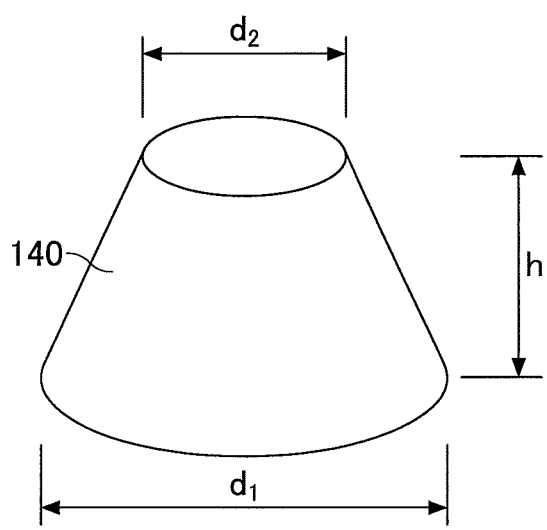
FIG. 11A and FIG. 11B are views for describing a test sample of a cup shear test.
Figure 11B:
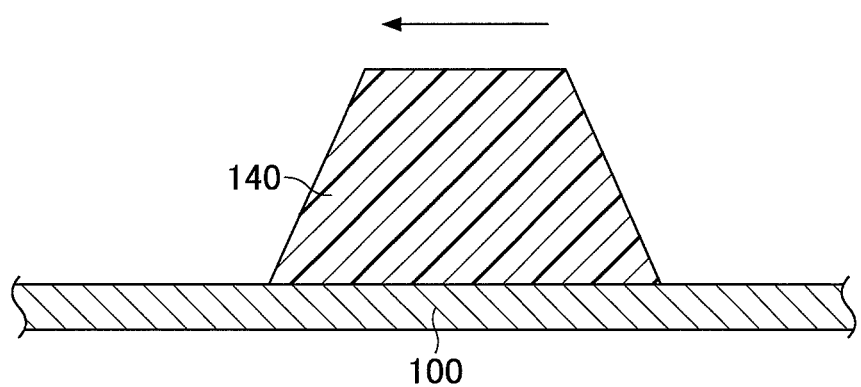

First, a test sample as illustrated in FIG. 11A and FIG. 11B was manufactured. Specifically, a convexo-concave portion was formed on an upper surface of a lead frame material 100, which was a flat metal plate made of copper. The convexo-concave portion included concave portions each of which was a circle whose diameter is greater than or equal to 0.020 mm and less than or equal to 0.060 mm, in a planar view. Then, without performing plating on a surface of the convexo-concave portion, a resin cup 140 was formed on the convexo-concave portion by a manufacturing condition as illustrated in Table 1. Six test samples were manufactured for six kinds of S ratios, and the measurement was performed for six times. Here, S ratio=1 means that the convexo-concave portion was not formed in the test sample (comparative example: conventional product). Measurement for the surface area for obtaining the S ratio was performed by using a 3D laser scanning microscope (manufactured by Olympus Corporation, LEXT OLS4100).

TABLE 1

| KIND OF RESIN | Epoxy resin |
|---|---|
| HEIGHT h | 3 mm |
| BOTTOM SURFACE DIAMETER $d_1$ | 3.568 mm |
| UPPER SURFACE DIAMETER $d_2$ | 3 mm |
| SURFACE AREA | 10.2 mm$^2$ |
| HEAT HISTORY | 175° C. × 1 h (N$_2$) + 230° C. × 10 min (air) |
| CURING CONDITION OF RESIN | 175° C. × 6 h (air) |

As illustrated in Table 1, a heat process of heating at 175° C. for 1 hour under nitrogen atmosphere, and thereafter, heating at 230° C. for 10 minutes in air was performed on the test sample as a heat history. The heat history was assumed as heat processes performed in a semiconductor chip mounting step (die attach step) and a wire bonding step that are performed before encapsulating the semiconductor chip or the like by the resin portion during the manufacturing steps from the lead frame to the semiconductor device.

This means that the lead frame is oxidized not a little by heating in such steps, which influences the adhesion between the resin portion and the lead frame. Thus, in this test as well, the resin cup 140 was formed after the heat history corresponding to the heat processes of the actual die attach step and the wire bonding step was applied to the lead frame material 100 of the test sample. With this, test results with high reliability can be obtained.

Next, a cup shear test was performed according to a method defined in SEMI (Semiconductor Equipment and Materials International) standards G69-0996. Specifically, shear strength was measured by pressing a gauge (not illustrated in the drawings) to the resin cup 140 of each of the test samples and moving in a direction of an arrow in FIG. 11B. The test was performed at room temperature (about 25° C.) where the height of the gauge was 20 μm and the speed was 200 μm/second.

Figure 12:
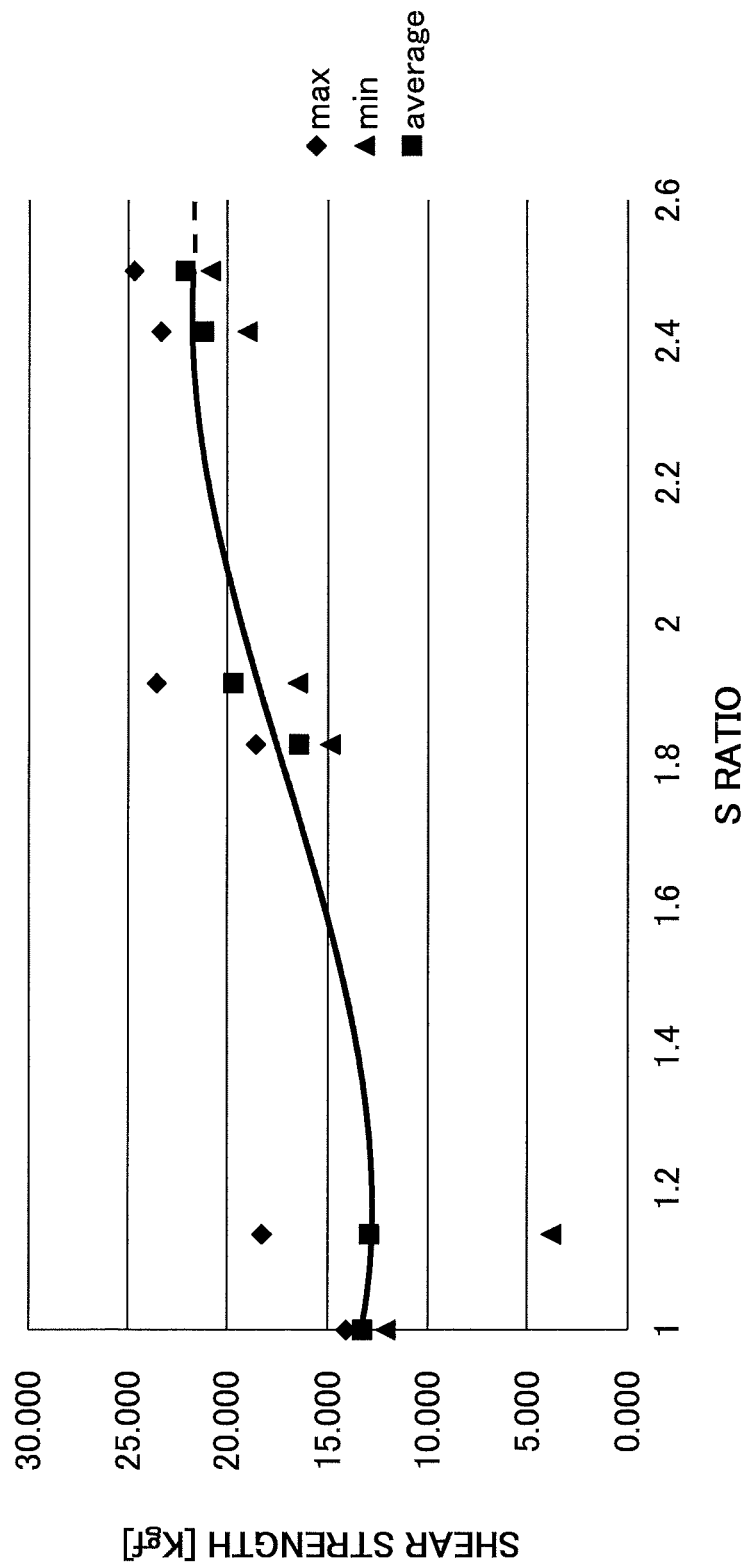
FIG. 12 is a view for describing a result of the cup shear test of example 1.

The result is illustrated in FIG. 12. With reference to FIG. 12, the average value of the shear strength was about 13 Kgf for the test sample of the comparative example (S ratio=1). On the other hand, for the test samples whose S ratio was greater than or equal to 1.8, the average value of the shear strength was greater than or equal to 17 Kgf. This means that it was revealed that the adhesion between the lead frame and the resin can be greatly improved from the conventional product when the S ratio is greater than or equal to 1.8. Here, when the S ratio becomes about 2.5, increasing of the shear strength is saturated. This is because a part of the resin is peeled (broken) before the interface between the lead frame and the resin is delaminated.

Example 2

The convexo-concave portion similar to that of example 1 was formed on the upper surface of the lead frame material 100 made of copper. Then, silver plating was performed on the surface of the convexo-concave portion, and the resin cup 140 was formed on the convexo-concave portion on which the silver plating was performed. Other than that, the cup shear test was performed similarly as example 1. The thickness of the silver plating film was about 6 μm.

Figure 13:
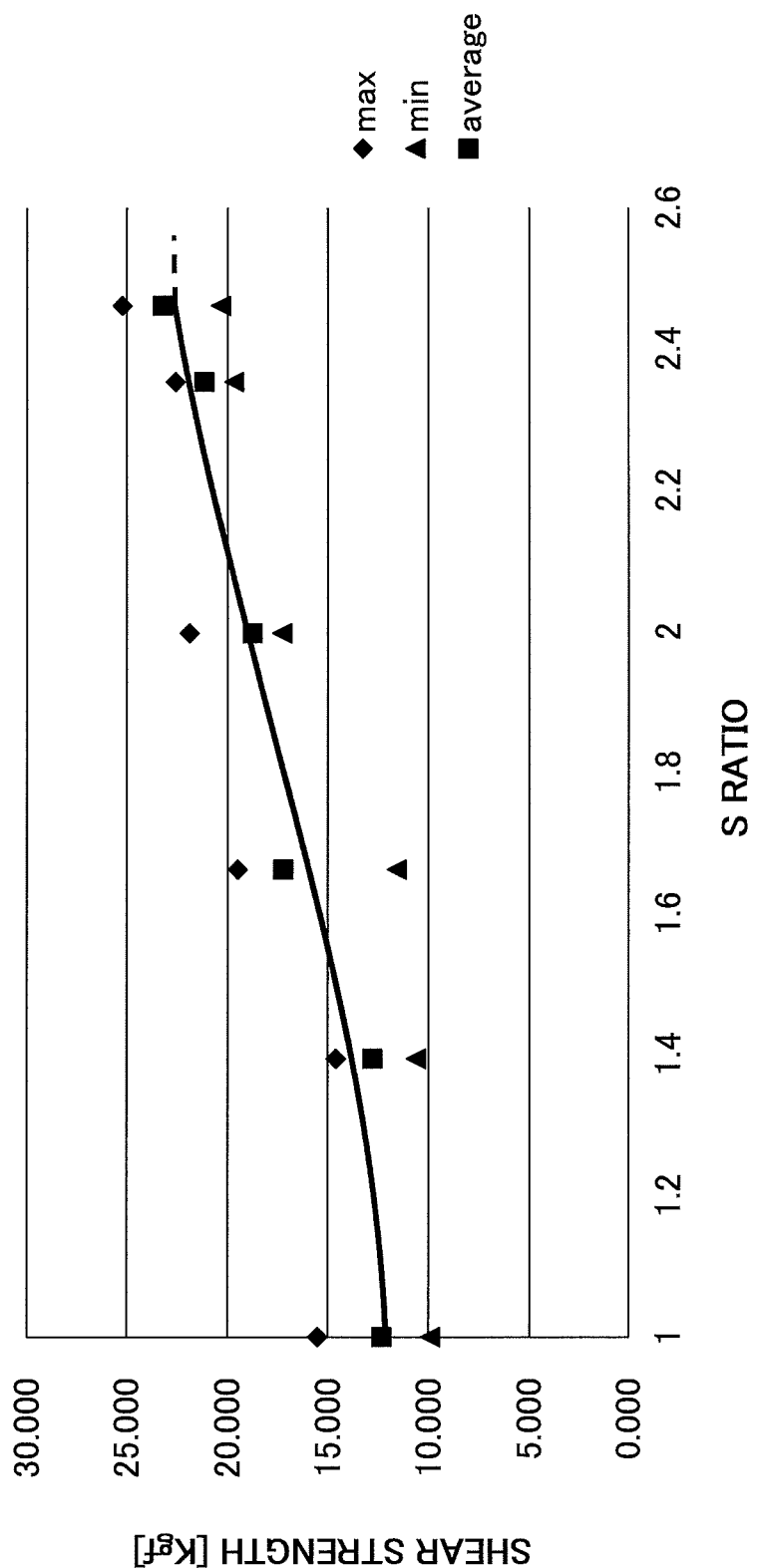
FIG. 13 is a view for describing a result of the cup shear test of example 2.

The result is illustrated in FIG. 13. With reference to FIG. 13, the average value of the shear strength for the test sample of the comparative example (S ratio=1) was about 13 Kgf. On the other hand, for the test samples whose S ratio (at a surface of the silver plating film) was greater than or equal to 1.7, the average value of the shear strength was greater than or equal to 17 Kgf. This means that the adhesion between the silver plating film formed on the lead frame and the resin can be greatly improved from the conventional product when the S ratio is greater than or equal to 1.7.

Example 3

The convexo-concave portion similar to that of example 1 was formed on the upper surface of the lead frame material 100 made of copper. Then, Ni/Pd/Au plating was performed on the convexo-concave portion, and the resin cup 140 was formed on the convexo-concave portion on which the Ni/Pd/Au plating was performed. Other than that, the cup shear test was performed similarly as example 1.

The Ni/Pd/Au plating means that a nickel plating film, a palladium plating film and a gold plating film are stacked on the upper surface of the lead frame material 100 in this order. In this example, the thickness of the nickel plating film was about 0.8 μm, the thickness of the palladium plating film was about 0.03 μm, and the thickness of the gold plating film was about 0.006 μm.

Figure 14:
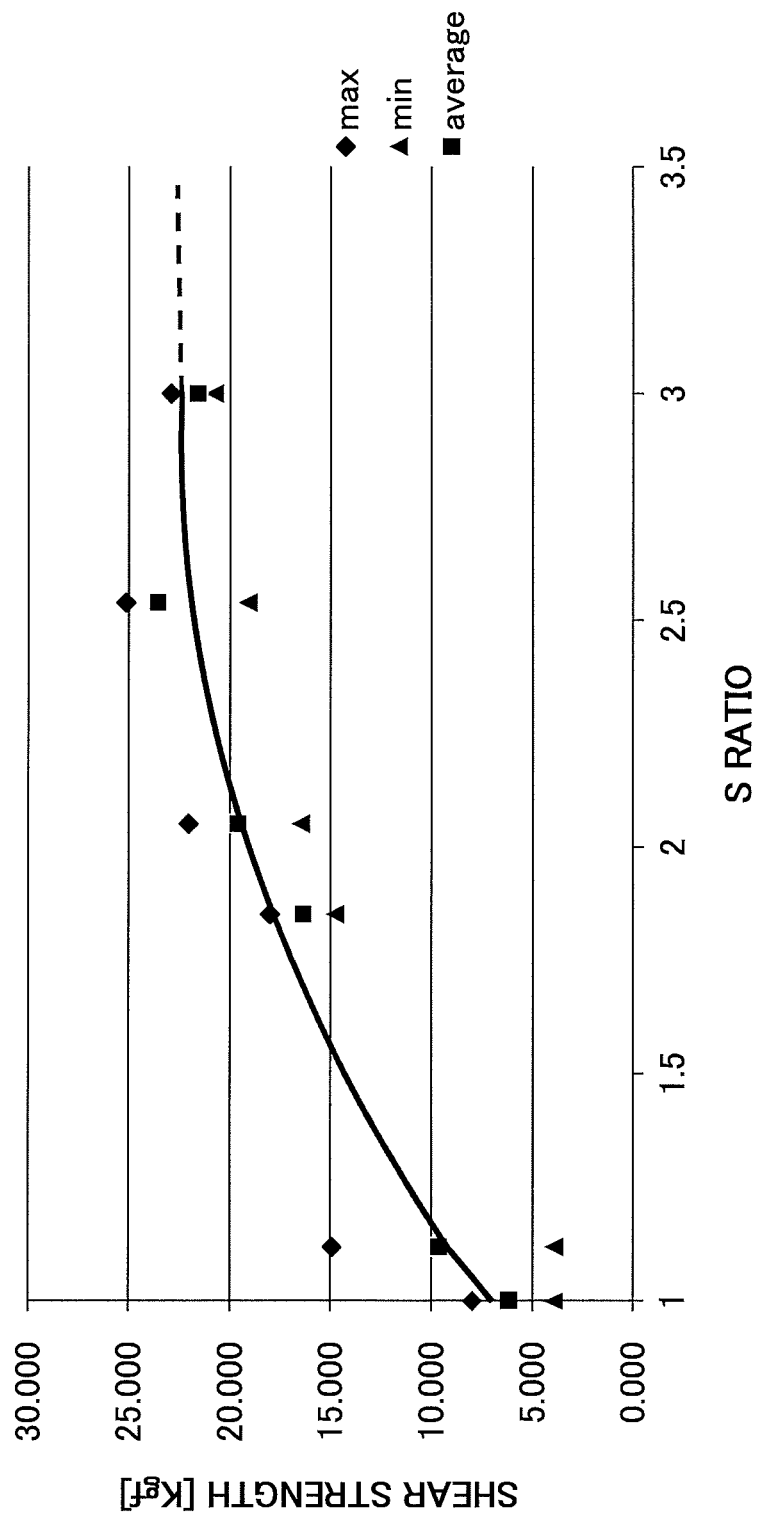
FIG. 14 is a view for describing a result of the cup shear test of example 3.

The result is illustrated in FIG. 14. With reference to FIG. 14, the average value of the shear strength for the test sample of the comparative example (S ratio=1) was about 6 Kgf. On the other hand, for the test samples whose S ratio (at a surface of the Ni/Pd/Au plating film) was greater than or equal to 1.8, the average value of the shear strength was greater than or equal to 17 Kgf. This means that the adhesion between the Ni/Pd/Au plating film formed on the lead frame and the resin can be greatly improved from the conventional product when the S ratio is greater than or equal to 1.8.

By forming a high density convexo-concave portion including concave portions, each of which is a circle whose diameter is greater than or equal to 0.020 mm and less than or equal to 0.060 mm, in a planar view, and whose S ratio is greater than or equal to 1.7 on the upper surface of the lead frame made of copper, surface area of the lead frame that contact the resin portion increases. Thus, an anchor effect is generated and the adhesion between the lead frame and the resin portion can be improved.

Further, as the high density convexo-concave portion can maintain the S ratio greater than or equal to a predetermined value after performing the silver plating or the Ni/Pd/Au plating, the adhesion between the lead frame and the resin portion can be improved when the resin portion is formed at the surface on which the plating is performed.

The preferably usable range of the S ratio is about 1.7 to 2.5, and regarding an effect of improving the adhesion and the saturation of improving the adhesion, the furthermore preferably usable range of the S ratio is about 1.8 to 2.0.

According to the embodiment, a semiconductor device in which a convexo-concave portion is formed at a surface of a lead frame and the surface area of the convexo-concave portion is increased to improve the adhesion with resin is provided.

When the planer shape of the concave portion of the convexo-concave portion is a polygon that contacts a circumcircle whose diameter is greater than or equal to 0.020 mm and less than or equal to 0.060 mm, it was confirmed that the same effect could be obtained.

Although a preferred embodiment of the lead frame, the semiconductor device and the method of manufacturing the lead frame has been specifically illustrated and described, it is to be understood that minor modifications may be made therein without departing from the spirit and scope of the invention as defined by the claims.

The present invention is not limited to the specifically disclosed embodiments, and numerous variations and modifications may be made without departing from the spirit and scope of the present invention.

For example, although the QFN type or QFP type lead frame is exemplified in the above embodiment, the present invention is applicable to other types of lead frames. As an example of the other types of lead frames, an LOC (Lead On Chip) type may be used.

Further, although an example in which the QFN type lead frame includes the die pad is described in the above embodiment, the QFN type lead frame may not include the die pad. The present invention is applicable to such a case as well.

Figure 15:
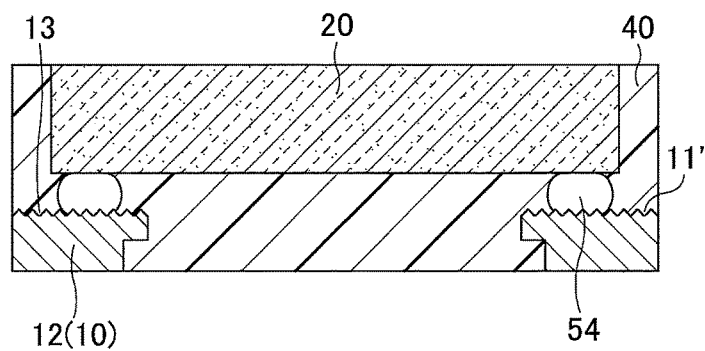
FIG. 15 is a cross-sectional view illustrating another example of the semiconductor device.

Further, the semiconductor chip 20 may be flip-chip mounted on the lead frame 10. FIG. 15 is a cross-sectional view illustrating another example of the semiconductor device. In such a case, the lead frame 10 only includes the leads 12. Electrode terminals of the semiconductor chip 20 are connected to the upper surface of the leads 12 via connection terminals 54. The connection terminals may be solder bumps, gold bumps, copper bumps or the like. The high density convexo-concave portion 13 is formed at connection areas of the leads 12 (lead frame 10) with the connection terminals 54, respectively. In such a case as well, plating 11' such as silver (Ag) plating or the like may be performed on the upper surface of the leads 12.

Various aspects of the subject-matter described herein are set out non-exhaustively in the following numbered clauses:

1. A method of manufacturing a lead frame including:
   forming a lead frame by etching a metal plate material; and
   forming a convexo-concave portion including a plurality of concave portions on a covered area of the lead frame which is to be covered by encapsulation resin,
   wherein the planer shape of each of the concave portions is a circle, the diameter of which is greater than or equal to 0.020 mm and less than or equal to 0.060 mm, or a polygon, the diameter of whose circumcircle is greater than or equal to 0.020 mm and less than or equal to 0.060 mm, and
   wherein a ratio $S/S_0$ is greater than or equal to 1.7 where "S" is a surface area of the convexo-concave portion that is formed at a flat surface whose surface area is "$S_0$".

2. The method of manufacturing the lead frame according to clause 1,
   wherein the forming the lead frame and the forming the convexo-concave portion are the same step, and
   wherein the lead frame and the convexo-concave portion are formed by etching using a same etching mask.

What is claimed is:

1. A semiconductor device comprising:
   a lead frame including a lead;
   a semiconductor chip mounted on the lead frame and electrically connected to the lead;
   a metal wire that electrically connects the lead and the semiconductor chip; and
   an encapsulation resin that covers at least a part of the lead of the lead frame and the semiconductor chip,
   wherein a convexo-concave portion including a plurality of concave portions is provided at a covered portion of the lead that is covered by the encapsulation resin, the convexo-concave portion being formed at a portion of the lead at which the metal wire is connected,
   wherein the planer shape of each of the concave portions is a circle, the diameter of which is greater than or equal to 0.020 mm and less than or equal to 0.060 mm, or a polygon, the diameter of whose circumcircle is greater than or equal to 0.020 mm and less than or equal to 0.060 mm,
   wherein the pitch of the concave portions is within a range of 0.040 to 0.080 mm, and
   wherein a ratio $S/S_0$ is greater than or equal to 1.7 where "S" is a surface area of the convexo-concave portion that is formed at a flat surface whose surface area is "$S_0$".

2. The semiconductor device according to claim 1, wherein a portion of the lead frame that is exposed from the encapsulation resin is formed to be a flatter surface than the surface of the lead at which the convexo-concave portion is formed.

3. The semiconductor device according to claim 1, further comprising:
   a plating film formed on the convexo-concave portion of the lead,
   wherein the ratio $S/S_0$ of the convexo-concave portion at which the plating film is formed is greater than or equal to 1.7.

4. A semiconductor device comprising:
   a lead frame including a lead;
   a semiconductor chip mounted on the lead frame and electrically connected to the lead;
   a connection terminal that electrically connects the lead and the semiconductor chip; and
   an encapsulation resin that covers at least a part of the lead of the lead frame and the semiconductor chip,
   wherein a convexo-concave portion including a plurality of concave portions is provided at a covered portion of the lead that is covered by the encapsulation resin, the convexo-concave portion being formed at a connection area of the lead with the connection terminal,
   wherein the planar shape of each of the concave portions is a circle, the diameter of which is greater than or equal to 0.020 mm and less than or equal to 0.060 mm, or a polygon, the diameter of whose circumcircle is greater than or equal to 0.020 mm and less than or equal to 0.060 mm,
   wherein the pitch of the concave portions is within a range of 0.040 to 0.080 mm, and
   wherein a ratio $S/S_0$ is greater than or equal to 1.7 where "S" is a surface area of the convexo-concave portion that is formed at a flat surface whose surface area is "$S_0$".

5. A lead frame comprising:
   a lead, at least a part of which is covered by encapsulation resin, the lead being electrically connected to a metal wire,
   wherein a convexo-concave portion including a plurality of concave portions is provided at a covered portion of the lead that is covered by the encapsulation resin, the convexo-concave portion being formed at a portion of the lead at which the metal wire is connected,
   wherein the planar shape of each of the concave portions is a circle, the diameter of which is greater than or equal to 0.020 mm and less than or equal to 0.060 mm, or a polygon, the diameter of whose circumcircle is greater than or equal to 0.020 mm and less than or equal to 0.060 mm,
   wherein the pitch of the concave portions is within a range of 0.040 to 0.080 mm, and
   wherein a ratio $S/S_0$ is greater than or equal to 1.7 where "S" is a surface area of the convexo-concave portion that is formed at a flat surface whose surface area is "$S_0$".

6. The lead frame according to claim 5, further comprising:
   a plating film formed on the convexo-concave portion of the lead,
   wherein the ratio $S/S_0$ of the convexo-concave portion at which the plating film is formed is greater than or equal to 1.7.

7. A lead frame comprising:
   a lead, at least a part of which is covered by encapsulation resin, the lead electrically contacting a connection terminal,
   wherein a convexo-concave portion including a plurality of concave portions is provided at a covered portion of the lead that is covered by the encapsulation resin, the convexo-concave portion being formed at a portion of the lead that contacts the connection terminal, wherein the planar shape of each of the concave portions is a circle, the diameter of which is greater than or equal to 0.020 mm and less than or equal to 0.060 mm, or a polygon, the diameter of whose circumcircle is greater than or equal to 0.020 mm and less than or equal to 0.060 mm, wherein the pitch of the concave portions is within a range of 0.040 to 0.080 mm, and wherein a ratio $S/S_0$ is greater than or equal to 1.7 where "S" is a surface area of the convexo-concave portion that is formed at a flat surface whose surface area is "$S_0$".

8. The lead frame according to claim 5,
wherein a portion of the lead frame that is exposed from the encapsulation resin is formed to be a flatter surface than the surface of the lead at which the convexo-concave portion is formed.

9. The semiconductor device according to claim 2,
wherein the lead includes an upper surface and a lower surface,
wherein the upper surface of the lead is the covered portion covered by the encapsulation resin and the lower surface of the lead is exposed from the encapsulating resin, and
wherein the convexo-concave portion is formed at the upper surface of the lead.

10. The semiconductor device according to claim 2,
wherein the lead includes an inner lead and an outer lead,
wherein the inner lead of the lead is the covered portion covered by the encapsulation resin and the outer lead of the lead is exposed from the encapsulating resin, and
wherein the convexo-concave portion is formed at the inner lead of the lead.

11. The semiconductor device according to claim 1,
wherein the lead frame includes a die pad on which the semiconductor chip is mounted, and
wherein the convexo-concave portion is provided at the die pad as well.

12. The semiconductor device according to claim 11,
wherein the die pad includes an upper surface and a lower surface,
wherein the upper surface of the die pad is the covered portion covered by the encapsulation resin and the lower surface of the die pad is exposed from the encapsulating resin, and
wherein the convexo-concave portion is formed at the upper surface of the die pad.

13. The semiconductor device according to claim 11,
wherein the lead frame further includes a support bar connected to the die pad, and
wherein the convexo-concave portion is provided at the support bar as well.

14. The lead frame according to claim 8,
wherein the lead includes an upper surface and a lower surface,
wherein the upper surface of the lead is the covered portion covered by the encapsulation resin and the lower surface of the lead is exposed from the encapsulating resin, and
wherein the convexo-concave portion is formed at the upper surface of the lead.

15. The lead frame according to claim 8,
wherein the lead includes an inner lead and an outer lead,
wherein the inner lead of the lead is the covered portion covered by the encapsulation resin and the outer lead of the lead is exposed from the encapsulating resin, and
wherein the convexo-concave portion is formed at the inner lead of the lead.

16. The lead frame according to claim 5, further comprising:
a die pad on which the semiconductor chip is mounted, and
wherein the convexo-concave portion is provided at the die pad as well.

17. The lead frame according to claim 16,
wherein the die pad includes an upper surface and a lower surface,
wherein the upper surface of the die pad is the covered portion covered by the encapsulation resin and the lower surface of the die pad is exposed from the encapsulating resin, and
wherein the convexo-concave portion is formed at the upper surface of the die pad.

18. The lead frame according to claim 16, further comprising:
a support bar connected to the die pad, and
wherein the convexo-concave portion is provided at the support bar as well.

19. The semiconductor device according to claim 4,
wherein a portion of the lead frame that is exposed from the encapsulation resin is formed to be a flatter surface than the surface of the lead at which the convexo-concave portion is formed.

20. The semiconductor device according to claim 4, further comprising:
a plating film formed on the convexo-concave portion of the lead,
wherein the ratio $S/S_0$ of the convexo-concave portion at which the plating film is formed is greater than or equal to 1.7.

21. The semiconductor device according to claim 19,
wherein the lead includes an upper surface and a lower surface,
wherein the upper surface of the lead is the covered portion covered by the encapsulation resin and the lower surface of the lead is exposed from the encapsulating resin, and
wherein the convexo-concave portion is formed at the upper surface of the lead.

22. The semiconductor device according to claim 19,
wherein the lead includes an inner lead and an outer lead,
wherein the inner lead of the lead is the covered portion covered by the encapsulation resin and the outer lead of the lead is exposed from the encapsulating resin, and
wherein the convexo-concave portion is formed at the inner lead of the lead.

23. The lead frame according to claim 7, further comprising:
a plating film formed on the convexo-concave portion of the lead,
wherein the ratio $S/S_0$ of the convexo-concave portion at which the plating film is formed is greater than or equal to 1.7.

24. The lead frame according to claim 7,
wherein a portion of the lead frame that is exposed from the encapsulation resin is formed to be a flatter surface than the surface of the lead at which the convexo-concave portion is formed.

25. The lead frame according to claim 24,
wherein the lead includes an upper surface and a lower surface, wherein the upper surface of the lead is the covered portion covered by the encapsulation resin and the lower surface of the lead is exposed from the encapsulating resin, and wherein the convexo-concave portion is formed at the upper surface of the lead.

26. The lead frame according to claim 24, wherein the lead includes an inner lead and an outer lead, wherein the inner lead of the lead is the covered portion covered by the encapsulation resin and the outer lead of the lead is exposed from the encapsulating resin, and wherein the convexo-concave portion is formed at the inner lead of the lead.

* * * * *